(12) United States Patent
Sato et al.

(10) Patent No.: US 11,967,912 B2
(45) Date of Patent: Apr. 23, 2024

(54) MOTOR CONTROL DEVICE AND ELECTRIC BRAKE DEVICE INCLUDING THE SAME

(71) Applicant: Hitachi Automotive Systems, Ltd., Hitachinaka (JP)

(72) Inventors: Hiroaki Sato, Tokyo (JP); Toshiyuki Ajima, Tokyo (JP); Kenichiro Matsubara, Hitachinaka (JP); Daisuke Goto, Hitachinaka (JP)

(73) Assignee: Hitachi Astemo, Ltd, Hitachinaka (JP)

( * ) Notice: Subject to any disclaimer, the term of this patent is extended or adjusted under 35 U.S.C. 154(b) by 571 days.

(21) Appl. No.: 17/261,642

(22) PCT Filed: Jun. 17, 2019

(86) PCT No.: PCT/JP2019/023947
§ 371 (c)(1),
(2) Date: Jan. 20, 2021

(87) PCT Pub. No.: WO2020/039720
PCT Pub. Date: Feb. 27, 2020

(65) Prior Publication Data
US 2021/0265936 A1    Aug. 26, 2021

(30) Foreign Application Priority Data

Aug. 24, 2018    (JP) ................. 2018-157098

(51) Int. Cl.
*H02P 23/14*       (2006.01)
*B60T 1/06*        (2006.01)
(Continued)

(52) U.S. Cl.
CPC .............. *H02P 23/14* (2013.01); *B60T 1/065* (2013.01); *B60T 13/746* (2013.01); *F16D 65/18* (2013.01);
(Continued)

(58) Field of Classification Search
CPC ...... H02P 23/14; H02P 23/0022; H02P 23/12; B60T 1/065; B60T 13/746; F16D 65/18;
(Continued)

(56) References Cited

U.S. PATENT DOCUMENTS 10,270,377 B2 * 4/2019 Sakamoto ........... H02P 21/0025
2001/0002097 A1 * 5/2001 Tsutsui ..................... G05B 5/01
318/560

(Continued)

FOREIGN PATENT DOCUMENTS

JP      2005-304155 A     10/2005
JP      2012-110166 A      6/2012
(Continued)

OTHER PUBLICATIONS

International Search Report with English translation and Written Opinion issued in corresponding application No. PCT/JP2019/023947 dated Sep. 10, 2019.

*Primary Examiner* — Jaime Figueroa
*Assistant Examiner* — Mohamad O El Sayah
(74) *Attorney, Agent, or Firm* — Foley & Lardner LLP (57) ABSTRACT

An object of the present invention is to provide a motor control device capable of estimating a delay with high accuracy even in a case where there is a fluctuation in disturbance torque or delay time and of suppressing the influence of the delay. For this end, the present invention includes a motor MTR, an ECU 2 that controls the rotation of the motor MTR, and an ECU 1 that sends a torque command to the ECU 2 based on a command value. The ECU 1 includes a disturbance estimation block 100 and a delay estimation block 200. The disturbance estimation block 100 estimates disturbance torque ($\tau d$) using a torque command input to the ECU 2 and a feedback value of the motor MTR. The delay estimation block 200 estimates a delay using a torque command output from the ECU 1, the feedback value of the motor MTR, and the disturbance torque ($\tau d$).

12 Claims, 7 Drawing Sheets

(51) Int. Cl.
*B60T 13/74* (2006.01)
*F16D 65/18* (2006.01)
*F16D 121/24* (2012.01)
*F16D 125/20* (2012.01)
*H02P 23/00* (2016.01)
*H02P 23/12* (2006.01)
*H03H 17/02* (2006.01)

(52) U.S. Cl.
CPC .......... *H02P 23/0022* (2013.01); *H02P 23/12* (2013.01); *H03H 17/0202* (2013.01); *F16D 2121/24* (2013.01); *F16D 2125/20* (2013.01); *H03H 2017/0205* (2013.01)

(58) Field of Classification Search
CPC ............ F16D 2121/24; F16D 2125/20; H03H 17/0202; H03H 2017/0205
See application file for complete search history.

(56) References Cited

U.S. PATENT DOCUMENTS

| | | | | |
|---|---|---|---|---|
| 2003/0230999 | A1* | 12/2003 | de Nanclares | H02P 6/08 318/716 |
| 2009/0243533 | A1* | 10/2009 | Zhang | H02P 29/00 318/632 |
| 2010/0327794 | A1* | 12/2010 | Ohshima | H02P 7/29 318/503 |
| 2013/0229137 | A1 | 9/2013 | Takahashi | |
| 2014/0055074 | A1* | 2/2014 | Yoshiura | G05B 11/42 318/610 |
| 2015/0151727 | A1* | 6/2015 | Yasui | B60T 8/58 701/70 |
| 2016/0318548 | A1* | 11/2016 | Tsubaki | B62K 21/08 |
| 2018/0154797 | A1* | 6/2018 | Sawada | B60L 15/2018 |
| 2018/0154873 | A1* | 6/2018 | Masuda | F16D 66/00 |

FOREIGN PATENT DOCUMENTS

| | | |
|---|---|---|
| JP | 2014-204538 A | 10/2014 |
| JP | 2018-057065 A | 4/2018 |

\* cited by examiner

MOTOR CONTROL DEVICE AND ELECTRIC BRAKE DEVICE INCLUDING THE SAME

TECHNICAL FIELD

The present invention relates to a motor control device and an electric brake device including the motor control device.

BACKGROUND ART

As the electrification of automobiles progresses, the number of installed electronic control units (ECUs) is increasing. An automobile is equipped with a plurality of ECUs as auxiliary machines for engine control, brake control, and the like, and also equipped with an ECU as a main machine for integrated control of a plurality of these ECUs. In a vehicle system composed of a plurality of ECUs, signals are communicated and controlled between the ECUs. In such a vehicle system, a signal delay due to communication between ECUs is likely to occur, causing control to become unstable. Therefore, a technique for stably controlling a system with a delay is desired. In the control that stabilizes a system with a delay, the delay is estimated by using a command value and a feedback value, thereby eliminating an influence of the delay to realize stable control. As such a technique, for example, a technique described in PTL 1 has been proposed.

CITATION LIST

Patent Literature

PTL 1: JP 2005-304155 A

SUMMARY OF INVENTION

Technical Problem

Motor control in a system with a delay requires not only stability but also the response that is as high as possible, and that a feedback value matches a command value in a steady state. Conventionally, as described in PTL 1, the influence of a delay has been eliminated by estimating the delay using a command value and a feedback value, and stable control has been performed. However, when parameter fluctuation and load of a motor and heat generation of the motor itself (these are referred to as disturbance torque herein) are generated, information of the disturbance torque is contained in the estimated delay, and the delay cannot be estimated with high accuracy. As a technique considering the influence of the disturbance, FIG. 7 of PTL 1 discloses a technique provided with a disturbance estimator that estimates the disturbance. However, since the disturbance estimation is performed after delay estimation, the influence of the disturbance has not been reflected. PTL 1 cannot estimate the delay with high accuracy in a case where the delay time fluctuates. In a case where the delay has not been able to be estimated with high accuracy, the control has become unstable and deterioration in the responsiveness has occurred. Further, a phenomenon in which a command value does not match a feedback value in a steady state (this is referred to as steady state deviation herein) has occurred.

An object of the present invention is to solve the above problem, and provide a motor control device capable of estimating a delay with high accuracy even in a case where there is a fluctuation in disturbance torque or delay time and suppressing the influence of the delay, and an electric brake device including the motor control device.

Solution to Problem

In order to achieve the above object, a motor control device of the present invention is characterized by including a motor, a lower control device that controls rotation of the motor, and an upper control device that sends a torque command to the lower control device based on a command value. The upper control device includes a disturbance estimation unit and a delay estimation unit, the disturbance estimation unit estimates disturbance by using a torque command input to the lower control device and a feedback value of the motor, and the delay estimation unit estimates a delay by using a torque command output from the upper control device, the feedback value of the motor, and disturbance torque estimated by the disturbance estimation unit.

Advantageous Effects of Invention

According to the present invention, a motor control device capable of estimating a delay with high accuracy even in a case where there is a fluctuation in disturbance torque or delay time and of suppressing the influence of the delay, and a brake device including the motor control device can be provided.

DESCRIPTION OF EMBODIMENTS

Embodiments of the present invention will be described in detail with reference to the drawings. However, the present invention is not limited to the embodiments below, and various modifications and applications within the technical concept of the present invention are also included in the scope of the present invention.

First Embodiment

Figure 1:
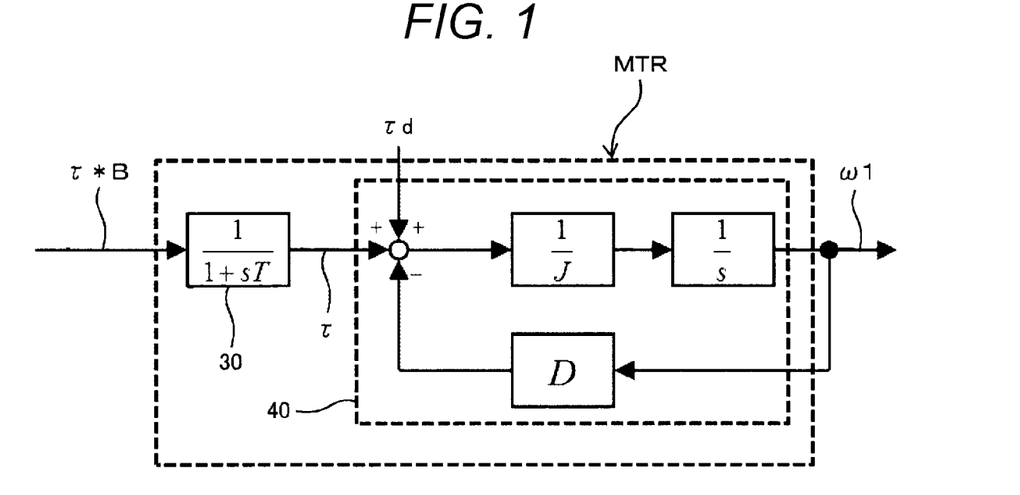
FIG. 1 is a diagram schematically showing, in blocks, a functional configuration of a motor MTR according to a first embodiment of the present invention.

Hereinafter, a first embodiment of the present invention will be described with reference to FIGS. 1 to 5. First, the configuration of a motor MTR which is a controlled object of the present invention will be briefly described. FIG. 1 is a diagram schematically showing a functional configuration of the motor MTR according to the first embodiment of the present invention in blocks. The motor MTR is composed of a torque generation unit 30 and a rotational motion unit 40. In FIG. 1, "s" represents the Laplace operator, "T" represents a torque time constant, "J" represents inertia, and "D" represents a viscous friction coefficient. A torque command ($\tau$*B), which is a control command value, is input to the motor MTR as a controlled object from a control device which is not illustrated, and motor torque ($\tau$), which is a control amount, is generated at the torque time constant (T). A relationship between the generated motor torque ($\tau$) and motor speed ($\omega$) can be expressed by the following equation of motion (1) using the inertia (J) and the viscous friction coefficient (D):

[Math. 1]

$$\frac{d}{dt}\omega = \frac{1}{J}\tau - \frac{D}{J}\omega \quad (1)$$

In addition, the process can be illustrated in blocks, as shown in FIG. 1. The present embodiment shows a case where the torque command ($\tau$*B) to be input to the motor MTR is generated in FIG. 1.

Figure 2:
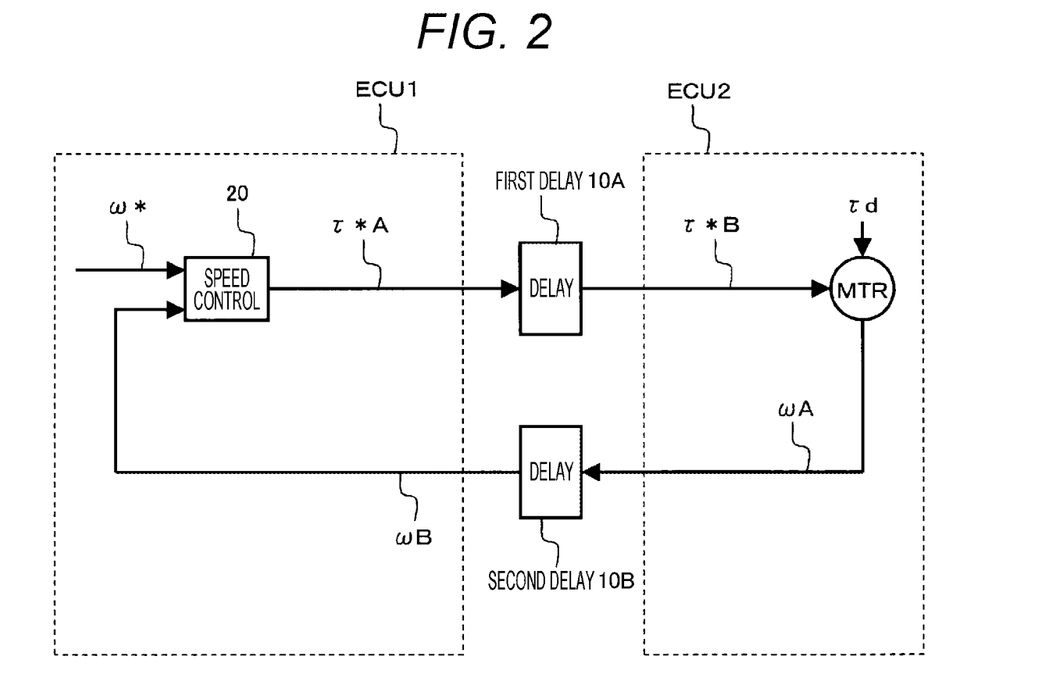
FIG. 2 is a diagram schematically showing, in blocks, a functional configuration of the motor and an ECU according to the first embodiment of the present invention.

FIG. 2 is a diagram schematically showing a functional configuration of the motor and an ECU according to the first embodiment of the present invention in blocks. As shown in FIG. 2, the motor MTR is controlled by an ECU 1 which is an upper control device and an ECU 2 which is a lower control device.

The ECU 2 which is a lower control device is a plurality of ECUs as auxiliary machines for, for example, engine control, brake control, and safety control. In the first embodiment, the ECU 2 is a device that controls rotation of the motor MTR. Further, the ECU 1 which is an upper control device is an EUC as a main machine that controls a plurality of ECUs in an integrated manner. In the first embodiment, the ECU 1 is a device that transmits a torque command to the ECU 2 based on a command value. Several tens of ECUs are installed in an automobile in recent years, and a plurality of these ECUs have become connected by an in-vehicle LAN. Also in the present embodiment, the ECU 1 and the ECU 2 are connected by an in-vehicle LAN to send and receive signals to and from each other. As a communication system, for example, a controller area network (CAN) communication protocol is used.

A signal of the ECU 1 is sent to the ECU 2 with a delay of a first delay 10A. A signal of the ECU 2 is sent to the ECU 1 with a delay of a second delay 10B. Note that the first delay 10A and the second delay 10B may change from moment to moment. The ECU 1 includes a speed control block 20 that generates a torque command ($\tau$*A) so as to allow a motor speed ($\omega$B) described later to follow a speed command ($\omega$*) sent from a control device which is not illustrated. The torque command ($\tau$*A) is sent to the ECU 2 in the first delay 10A, input to the ECU 2, and recognized as the torque command ($\tau$*B) in the ECU 2. The motor MTR is driven based on the torque command ($\tau$*B). A motor speed ($\omega$A), which is the speed of the motor MTR, is sent to the ECU 1 in the second delay 10B, and is recognized as the motor speed ($\omega$B) in the ECU 1. The motor speed ($\omega$B) is a feedback value of the motor including the second delay 10B.

If there is the first delay 10A or the second delay 10B, there will be a discrepancy between the motor speed ($\omega$B) recognized by the ECU 1 and the motor speed ($\omega$A) recognized by the ECU 2. Further, the torque command ($\tau$*A) generated by the ECU 1 is not immediately reflected on the motor MTR. Accordingly, if an attempt is made to allow the motor speed ($\omega$B) follow the speed command ($\omega$*), the control becomes unstable and the motor speed ($\omega$A) and the motor speed ($\omega$B) oscillate.

Further, in the actual motor MTR, the motor torque ($\tau$) is rarely generated according to the torque time constant (T) of the torque generation unit 30, and the inertia (J) and the viscous friction coefficient (D) peculiar to the motor MTR are rarely grasped accurately. Further, in general, some load is often applied to the motor MTR, and it is rare that all the input torque commands ($\tau$*B) contribute to the motor speed ($\omega$A).

In an embodiment described below, variation in these parameters, load, and the like will be all expressed as disturbance torque ($\tau$d) in the form of being added to the torque ($\tau$) of the motor MTR as shown in FIG. 1.

Figure 3:
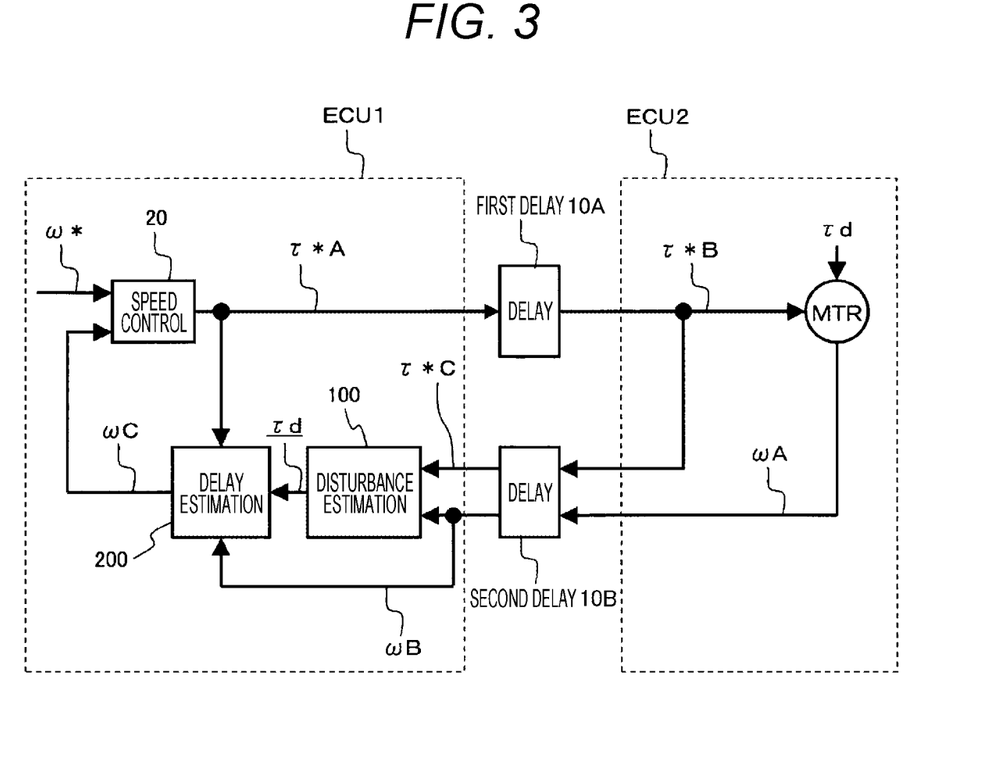
FIG. 3 is a control block diagram according to the first embodiment of the present invention.

FIG. 3 is a control block diagram according to the first embodiment of the present invention. Like FIG. 2, the motor MTR is controlled by the ECU 1 and the ECU 2, and signals are transmitted and received between the ECU 1 and the ECU 2 with the first delay 10A and the second delay 10B.

The ECU 1 includes the speed control block 20, a disturbance estimation block 100 as a disturbance estimation unit, and a delay estimation block 200 as a delay estimation unit. Note that these are shown as a control block in FIG. 3. However, the control block can be regarded as a "control function" since the control block is actually a function executed by software by a device such as a microcomputer. Further, in FIG. 3 and subsequent diagrams, the control block can be regarded as a "control function".

Here, the disturbance estimation block 100 shown in FIG. 3 has a function of obtaining (estimating) the disturbance torque ($\tau$d) from the torque command ($\tau$*C) recognized in the ECU 1 via the second delay 10B from the torque command ($\tau$*B) input to the motor MTR and the motor speed ($\omega$B). The disturbance estimation block 100, which uses the motor speed ($\omega$B) and the torque command ($\tau$*C) recognized via the second delay 10B which is the same delay, can obtain (estimate) only the disturbance torque. The disturbance estimation block 100 outputs as estimated disturbance torque ($\underline{\tau d}$). In other words, the disturbance estimation block 100 estimates the disturbance using the torque command ($\tau$*C) input by the ECU 1 and the motor speed ($\omega$B) which is a feedback value of the motor MTR.

Further, the delay estimation block 200 estimates a delay from the torque command ($\tau$*A) generated by the speed control block 20, the motor speed ($\omega$B), and the estimated disturbance torque ($\underline{\tau d}$), corrects the motor speed ($\omega$B), and output it as corrected motor speed ($\omega$C).

In the present embodiment, the delay can be estimated by inputting the torque command ($\tau^*A$) without delay and the motor speed ($\omega B$) with delay to the delay estimation block 200. The motor speed ($\omega B$) contains information on the disturbance torque ($\tau d$). In view of the above, in the present embodiment, by inputting the estimated disturbance torque ($\underline{\tau d}$) to the delay estimation block 200, the disturbance torque ($\tau d$) and the delay are estimated separately, and delay is estimated with high accuracy even in a case where the disturbance torque ($\tau d$) and a fluctuation of a delay amount are generated. The delay estimation block 200 estimates a delay, corrects the motor speed ($\omega B$) to calculate the corrected motor speed ($\omega C$), and sends it to the speed control block 20. Here, the corrected motor speed ($\omega C$) is obtained by correcting the motor speed ($\omega B$) so that the speed matches with the motor speed ($\omega A$) (or an error is reduced).

The speed control block 20 uses the corrected motor speed ($\omega C$) to generate the torque command ($\tau^*A$) so that the motor speed ($\omega A$) or the motor speed ($\omega B$) follows the speed command ($\omega^*$), and control can be performed without causing steady state deviation while high responsiveness and stability are achieved.

Figure 4:
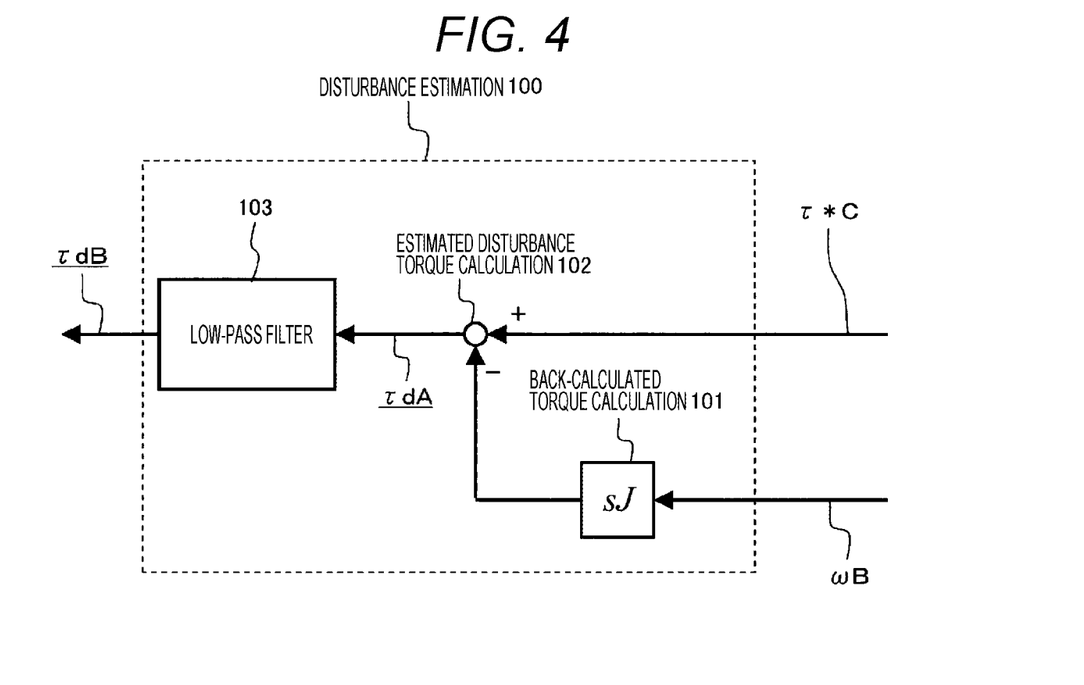
FIG. 4 is a configuration diagram of a disturbance estimation block according to the first embodiment of the present invention.

Next, the disturbance estimation block 100 used in the present embodiment will be described with reference to FIG. 4. FIG. 4 is a configuration diagram of the disturbance estimation block according to the first embodiment of the present invention. As shown in FIG. 4, the disturbance estimation block 100 is composed of a back-calculated torque calculation block 101 as a back-calculated torque calculation unit, an estimated disturbance torque calculation block 102 as an estimated disturbance torque calculation unit, a low-pass filter 103, and the like.

The back-calculated torque calculation block 101 back-calculates the motor speed ($\omega B$), which is the feedback value of the motor MTR, to calculate back-calculated torque ($\tau r$). Specifically, the back-calculated torque calculation block 101 differentiates the motor speed ($\omega B$) and multiplies this by the inertia (J) of the motor MTR to calculate the back-calculated torque ($\tau r$). This calculation result is substantially equivalent to the torque ($\tau$) of the motor MTR containing the disturbance torque ($\tau d$). Then, this back-calculated torque ($\tau r$) is input to the estimated disturbance torque calculation block 102.

The torque command ($\tau^*C$) is input to the estimated disturbance torque calculation block 102 in addition to the back-calculated torque ($\tau r$), and a difference between the torque command ($\tau^*C$) and the back-calculated torque ($\tau r$) is obtained. In this manner, the disturbance torque ($\tau d$) is estimated as differential torque ($\underline{\tau dA}$). The differential torque ($\underline{\tau dA}$) obtained by the estimated disturbance torque calculation block 102 is input to the low-pass filter 103 where high-frequency noise and the like are removed, and is sent and input as estimated disturbance torque ($\underline{\tau dB}$) to the delay estimation block 200 in the subsequent stage.

Figure 5:
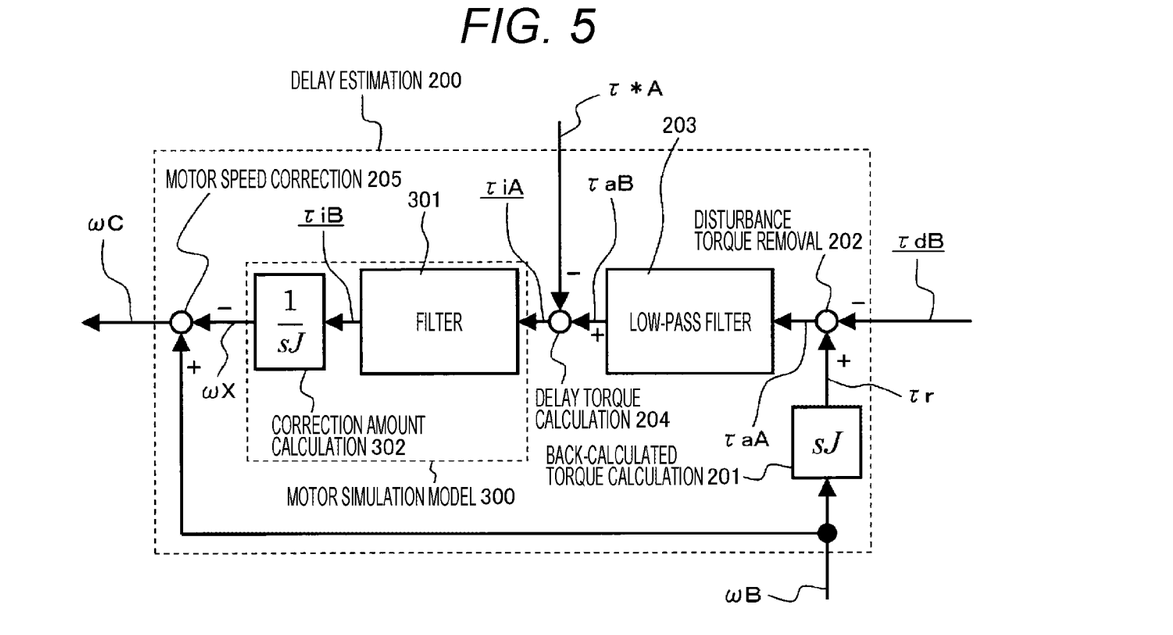
FIG. 5 is a configuration diagram of a delay estimation block according to the first embodiment of the present invention.

Next, the delay estimation block 200 used in the present embodiment will be described with reference to FIG. 5. FIG. 5 is a configuration diagram of the delay estimation block according to the first embodiment of the present invention. The delay estimation block 200 is composed of a back-calculated torque calculation block 201, a disturbance torque removal block 202, a low-pass filter 203, a delay torque calculation block 204, a motor simulation model 300, and the like.

The back-calculated torque calculation block 201 back-calculates the motor speed ($\omega B$), which is the feedback value of the motor MTR, to calculate back-calculated torque ($\tau r$). Specifically, the back-calculated torque calculation block 201 differentiates the motor speed ($\omega B$) and multiplies this by the inertia (J) of the motor MTR to calculate the back-calculated torque ($\tau r$). This calculation result is substantially equivalent to the torque ($\tau$) of the motor MTR containing the disturbance torque ($\tau d$). Then, this back-calculated torque ($\tau r$) is input to the disturbance torque removal block 202.

The estimated disturbance torque ($\underline{\tau dB}$) is input to the disturbance torque removal block 202 in addition to the back-calculated torque ($\tau r$), and a difference between the back-calculated torque ($\tau r$) and the estimated disturbance torque ($\underline{\tau dB}$) is obtained. In this manner, the estimated disturbance torque ($\underline{\tau dB}$) is removed from the back-calculated torque ($\tau r$) and calculated as generated torque ($\tau aA$). The generated torque ($\tau aA$) is input to the low-pass filter 203 where high-frequency noise and the like are removed to become generated torque ($\tau aB$), and is input to the delay torque calculation block 204.

The delay torque calculation block 204 as a delay torque calculation unit estimates delay torque based on the motor speed ($\omega B$) which is the feedback value of the motor MTR, the disturbance torque ($\tau d$), and the torque command ($\tau^*A$). Specifically, the torque command ($\tau^*A$) is input to the delay torque calculation block 204 in addition to the generated torque ($\tau aB$), and a difference between the generated torque ($\tau aB$) and the torque command ($\tau^*A$) is obtained. In this manner, delay torque ($\tau i$) corresponding to the delay due to the first delay 10A and the second delay 10B is estimated and input to the motor simulation model 300 as estimated delay torque ($\underline{\tau iA}$).

The motor simulation model 300 is a model that simulates the motor MTR, and is composed of a filter 301, a correction amount calculation block 302, and the like. The motor simulation model 300 inputs delay torque and corrects the feedback value of the motor recognized by the ECU 1. More specifically, the estimated delay torque ($\underline{\tau iA}$) is input to the motor simulation model 300, and a fluctuation amount of the motor speed ($\omega B$) due to the delay torque ($\tau i$) is calculated.

The filter 301 simulates, for example, the torque generation unit 30 in FIG. 1. The estimated delay torque ($\underline{\tau iA}$) is input to the filter 301, and output of the filter 301 is input to the correction amount calculation block 302 as estimated delay torque ($\tau iB$).

The correction amount calculation block 302 is, for example, one that simulates the inertia (J) of the motor MTR in FIG. 1. The correction amount ($\omega X$) is obtained by integrating the estimated delay torque ($\underline{\tau iB}$) and dividing it by the inertia (J) of the motor MTR. The obtained correction amount ($\omega X$) is input to a motor speed correction block 205.

The motor speed correction block 205 receives the motor speed ($\omega B$) as an input in addition to the correction amount ($\omega X$), and obtains a difference between the motor speed ($\omega B$) and the correction amount ($\omega X$) so as to calculate the corrected motor speed ($\omega C$) by removing the influence of the first delay 10A and the second delay 10B from the motor speed ($\omega B$).

As shown in FIG. 3, the speed control block 20 calculates the torque command ($\tau^*A$) by receiving the speed command ($\omega^*$) and the corrected motor speed ($\omega C$) as inputs. Here, the configuration of the speed control block 20 is to calculate the torque command ($\tau^*A$) so that the corrected motor speed ($\omega C$) matches with the speed command ($\omega^*$), and the configuration of the speed control block 20 is not limited in particular. For example, PI control may be performed.

Figure 6A:
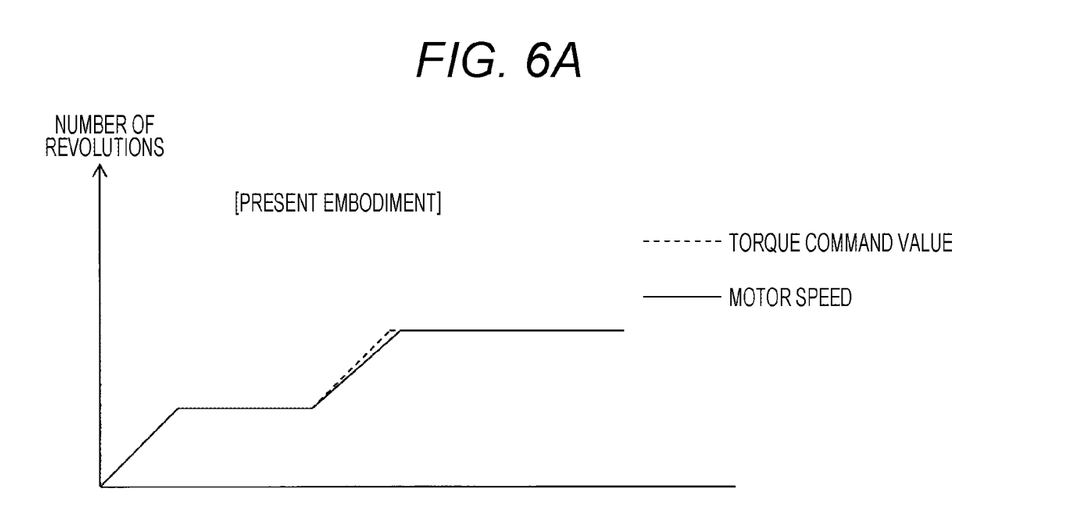
FIG. 6A is a diagram showing a relationship between a torque command value and a motor speed in the present embodiment.

Next, a relationship between the first embodiment and a comparative example will be described with reference to FIG. 6. FIG. 6A is a diagram showing a relationship between the torque command value and the motor speed in the present embodiment, FIG. 6B is a diagram showing a relationship between the torque command value and the motor speed in a first comparative example, and FIG. 6C is a diagram showing a relationship between the torque command value and the motor speed in a second comparative example.

Figure 6B:
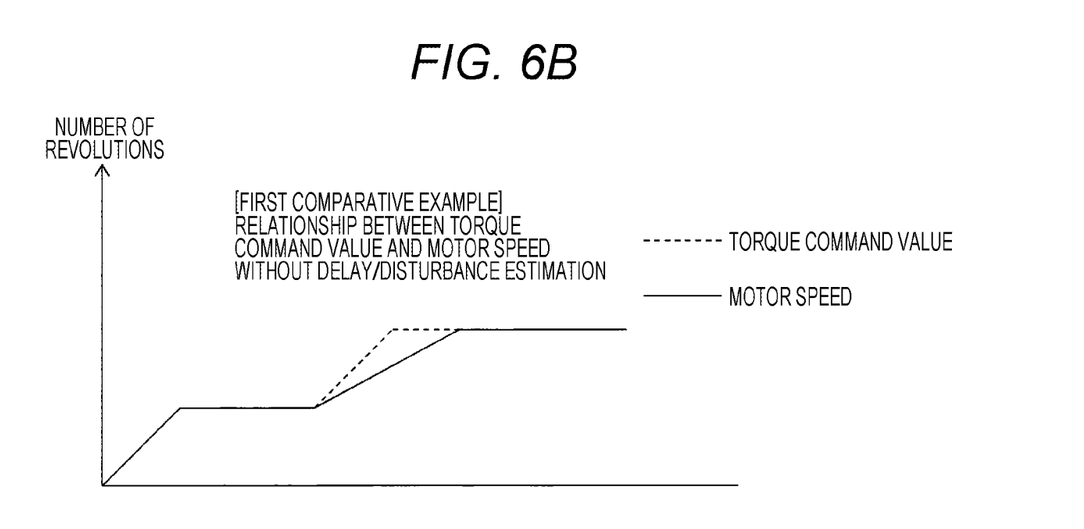
FIG. 6B is a diagram showing a relationship between a torque command value and a motor speed in a first comparative example.

The first comparative example shown in FIG. 6B shows control without delay estimation/disturbance estimation, and the broken line shows the torque command value and the solid line shows the motor speed. In a case where the torque command value for increasing torque is output during motor rotation, the motor speed follows the torque command value with a delay because there is no delay estimation/disturbance estimation control in FIG. 6B. As described above, in the first comparative example, the motor speed ($\omega$B) input to the speed control block 20 is a signal delayed by the first delay 10A and the second delay 10B. Accordingly, there has been a problem that, when an attempt is made to match the signal with the speed command ($\omega$*), the control becomes unstable. Further, there has also been a technique to correct the motor speed ($\omega$B) by estimating delay from the torque command ($\tau$*A) and the motor speed ($\omega$B). However, since there has been no disturbance estimation, information of the disturbance torque ($\tau$d) has been contained in estimated delay, the delay has not been able to be estimated with high accuracy, and the motor speed ($\omega$B) has not been able to be corrected appropriately.

Figure 6C:
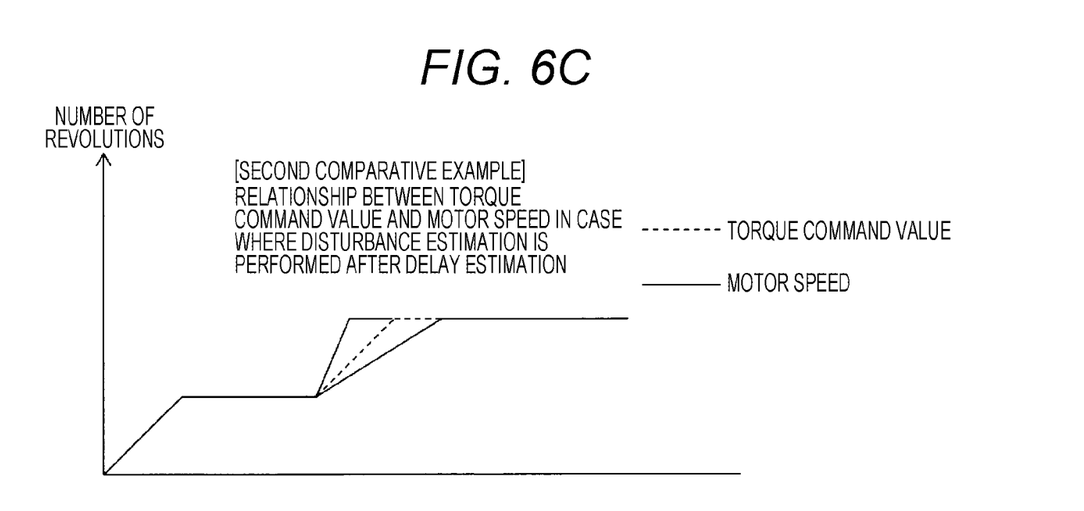
FIG. 6C is a diagram showing a relationship between a torque command value and a motor speed in a second comparative example.

Next, the second comparative example shown in FIG. 6C shows control of performing disturbance estimation after delay estimation, and the broken line shows the torque command value and the solid line shows the motor speed. In a case where the torque command value that increases torque is output during motor rotation, since disturbance estimation control is performed after delay estimation in FIG. 6C, if a parameter fluctuation or a load change occurs, the control becomes unstable, and the motor speed rises ahead of the torque command value or the motor speed follows with a delay.

FIG. 6A shows the control of the present embodiment, and the broken line shows the torque command value, and the solid line shows the motor speed. In a case where the torque command value that increases torque is output during motor rotation, disturbance estimation is performed and then delay estimation control is performed in the present embodiment. Accordingly, the delay can be estimated with high accuracy and the motor speed ($\omega$B) can be corrected. In this manner, in the present embodiment, the motor speed can follow the torque command with almost no delay, and a highly responsive and stable control device can be provided.

As described above, the present embodiment has a configuration, in which the disturbance estimation block that estimates only the disturbance torque of the motor is provided and also the delay estimation block that corrects the motor speed based on the torque command without delay, the motor speed with delay, and the output of the disturbance estimation block is provided, and, if disturbance torque is generated, an estimation result of the disturbance torque is reflected on the delay estimation block. According to the present embodiment, even in a case where there is a fluctuation in disturbance torque or delay, the disturbance torque and delay can be estimated separately, and the delay can be estimated with high accuracy. Accordingly, it is possible to provide a control device that is highly responsive and stable with respect to a system with delay, and does not generate steady state deviation.

In the first embodiment, the example in which the motor MTR is controlled by the ECU 1 which is the upper control device and the ECU 2 which is the lower control device is described. However, the present embodiment is not limited to this configuration. For example, the configuration may be such that a power conversion device is connected to the upper control device (control device). The control device includes the above-mentioned disturbance estimation unit and delay estimation unit.

The control device generates a torque command to be input to the motor MTR and sends it to the power conversion device. The power conversion device receives the torque command from the control device and applies voltage to the motor MTR based on the torque command.

The disturbance estimation unit estimates the disturbance from the feedback value, which is a control amount of the motor MTR, and the voltage applied to the motor MTR. The delay estimation unit estimates the delay from the torque command, the feedback value of the motor MTR, and the estimated disturbance.

The motor MTR may be in unloaded operation with no load. When the motor MTR is performing unloaded operation, the heat generated by the motor MTR is small, and the influence of the control amount due to the characteristics unique to the motor MTR is also small. That is, in a case where the motor MTR is performing unloaded operation, the influence of the disturbance torque is small. In view of the above, the function of the disturbance estimation unit is stopped while the motor MTR is performing unloaded operation. Then, the delay estimation unit estimates the delay from the torque command and the feedback value of the motor MTR, and sets the estimated delay to the voltage input to the disturbance estimation unit.

According to such an embodiment, the function of the disturbance estimation unit is stopped while the motor MTR is performing unloaded operation, and the delay estimation unit estimates the delay from the torque command and the feedback value of the motor MTR. Therefore, power consumption can be suppressed.

Second Embodiment

Figure 7:
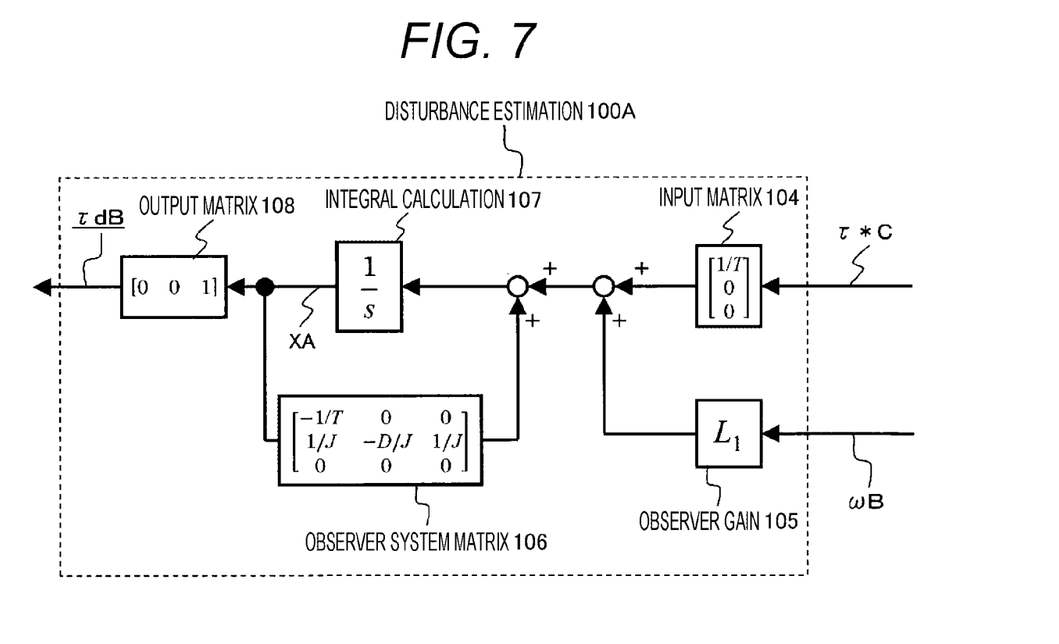
FIG. 7 is a configuration diagram of the disturbance estimation block according to a second embodiment of the present invention.

Next, the motor control device of a second embodiment of the present invention will be described with reference to FIG. 7. FIG. 7 is a configuration diagram of the disturbance estimation block according to the second embodiment of the present invention. In the second embodiment, the disturbance estimation block 100 used in the first embodiment is composed of an observer (state observer), a Kalman filter, or the like, and state estimation in a case where the state of the control system cannot be directly observed is performed. In other words, the observer and the Kalman filter function as a state estimation unit.

In the first embodiment, as shown in FIG. 4, the disturbance estimation block 100 obtains (estimates) the estimated disturbance torque ($\tau$dB) from a difference between the torque command ($\tau$*C) and the back-calculated torque ($\tau$r) obtained from the motor speed ($\omega$B). However, the disturbance estimation block 100 shown in FIG. 4 requires differential operation even if it is approximate, and is limited to the case where noise is hardly included from the view point of actual application. Further, there is an aspect that it is difficult to directly estimate all the disturbance torque ($\tau$d), which may increase the product cost due to the addition of a detection sensor.

In view of the above, in the second embodiment, the disturbance torque ($\tau$d) is estimated without adding a new detection sensor and without a problem even if noise is contained, so that the control device that has improved accuracy of the delay estimation and is robust against delay. The configuration of the motor control device according to the second embodiment is basically similar to that of the first embodiment, except that the disturbance estimation block 100 is composed of an observer.

This observer provides a mathematical model for estimating the internal state of the motor MTR, estimates the disturbance torque from the torque command (τ*C) which is the control command of the motor MTR and the measurement of the motor speed (ωB), and is implemented as a mathematical model in an arithmetic unit such as a microcomputer. Note that the observer may be a Kalman filter.

The mathematical model for estimating the disturbance torque (τd) is expressed by Equation below.

[Math. 2]

$$\frac{d}{dt}\begin{bmatrix} \tau \\ \omega \\ \tau_d \end{bmatrix} = \begin{bmatrix} -1/T & 0 & 0 \\ 1/J & -D/J & 1/J \\ 0 & 0 & 0 \end{bmatrix}\begin{bmatrix} \tau \\ \omega \\ \tau_d \end{bmatrix} + \begin{bmatrix} 1/T \\ 0 \\ 0 \end{bmatrix}\tau^* \quad (2)$$

$$\omega = \begin{bmatrix} 0 & 1 & 0 \end{bmatrix}\begin{bmatrix} \tau \\ \omega \\ \tau_d \end{bmatrix}$$

Equation (2) describes the disturbance torque (τd) input to the motor MTR as a state quantity. There is a system of estimating a state using an observer gain (L1) for the mathematical model expressed by Equation (2). When expressed as an equation, Equation (3) is obtained.

[Math. 3]

$$\frac{d}{dt}\begin{bmatrix} \hat{\tau} \\ \hat{\omega} \\ \hat{\tau}_d \end{bmatrix} = \begin{bmatrix} -1/T & 0 & 0 \\ 1/J & -D/J & 1/J \\ 0 & 0 & 0 \end{bmatrix}\begin{bmatrix} \hat{\tau} \\ \hat{\omega} \\ \hat{\tau}_d \end{bmatrix} + \begin{bmatrix} 1/T \\ 0 \\ 0 \end{bmatrix}\tau^* - L_1\omega \quad (3)$$

$$\hat{\tau}_d = \begin{bmatrix} 0 & 0 & 1 \end{bmatrix}\begin{bmatrix} \hat{\tau} \\ \hat{\omega} \\ \hat{\tau}_d \end{bmatrix}$$

Here, the observer gain (L1) may be set for the purpose of defining the time until the estimation of the disturbance torque (τd) converges, stabilizing the disturbance estimation block, and the like. The observer expressed by Equation (3) is implemented in the disturbance estimation block 100 in FIG. 3, and is shown in the block as in FIG. 7.

A disturbance estimation block 100A in the second embodiment is composed of an input matrix block 104, an observer gain block 105, an observer system matrix block 106, an integral calculation block 107, and an output matrix block 108. The torque command (τ*C) is input to the input matrix block 104, and the motor speed (ωB) is input to the observer gain block 105. Further, an estimated state (XA) which is the output of the integral calculation block 107 is input to the observer system matrix block 106. Outputs of the input matrix block 104, the observer gain block 105, and the observer system matrix block 106 are added together, input to the integral calculation block 107, and output as the estimated state (XA). The estimated state (XA), which is the output of the integral calculation block 107, is input to the output matrix block 108 and output as the estimated disturbance torque (τdB). The input matrix block 104, the observer gain block 105, and the observer system matrix block 106 are constant matrices of the state equation represented by Equation (3). In this way, the disturbance torque (τd) can be obtained (estimated) by expressing the disturbance torque (τd) as a state in the state equation.

The disturbance estimation block 100A in the second embodiment has a configuration generally called a same-dimensional observer. However, if necessary, a minimum-dimensional observer, a linear function observer, or the like can be used. Furthermore, it goes without saying that various disturbance estimation means such as a stationary Kalman filter which is an optimized version of the same-dimensional observer may also be applied.

Note that the disturbance estimation block 100A can be used for the purpose of estimating the disturbance torque (τd) as well as the purpose of estimating other state quantities.

According to the second embodiment, it is possible to provide a noise-resistant device which does not require differentiation as in the disturbance estimation block 100 described in the first embodiment. Furthermore, according to the second embodiment, since it is not necessary to add a special detection sensor, an increase in product cost can be suppressed.

Third Embodiment

Figure 8:
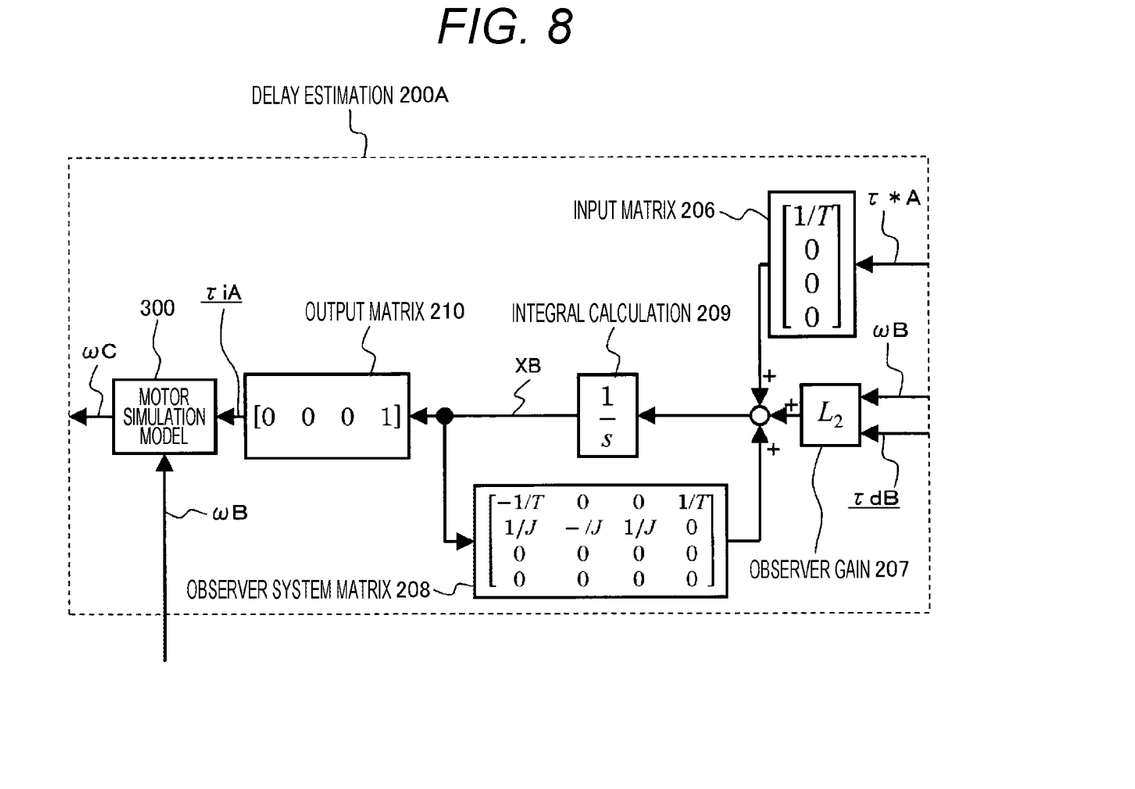
FIG. 8 is a configuration diagram of the delay estimation block according to a third embodiment of the present invention.

Next, the motor control device of a third embodiment of the present invention will be described with reference to FIG. 8. FIG. 8 is a configuration diagram of the delay estimation block according to the third embodiment of the present invention. In the third embodiment, the delay estimation block 200 used in the first embodiment and the second embodiment is composed of an observer (state observer), a Kalman filter, or the like, and state estimation in a case where the state of the control system cannot be directly observed is performed.

In the first and second embodiments, the delay estimation block 200 obtains (estimates) the estimated delay torque (τiA) of the delay corresponding to the first delay 10A and the second delay 10B from the torque command (τ*A), the estimated disturbance torque (τdB), and the motor speed (ωB), as shown in FIG. 5. However, the delay estimation block 200 shown in FIG. 5 requires differential operation even if it is approximate, and is limited to the case where noise is hardly included from the view point of actual application. Further, there is an aspect that it is difficult to directly estimate all delay disturbances, which may increase the product cost due to the addition of a detection sensor.

In view of the above, in the third embodiment, the delay is estimated without adding a new detection sensor and without a problem even if noise is contained, so that the control device that has improved accuracy of the delay estimation and is robust against delay. The configuration of the motor control device according to the third embodiment is basically similar to that of the first and second embodiments, except that the delay estimation block 200 is composed of an observer.

This observer provides a mathematical model for estimating the internal state of the motor MTR, estimates the delay torque (τi) from the torque command (τ*C) which is the control command of the motor MTR and the measurement of the motor speed (ωB), and is implemented as a mathematical model in an arithmetic unit such as a microcomputer. Note that the observer may be a Kalman filter.

The mathematical model in the delay estimation of the third embodiment is expressed by Equation (4) below.

[Math. 4]

$$\frac{d}{dt}\begin{bmatrix} \tau \\ \omega \\ \tau_d \\ \tau_i \end{bmatrix} = \begin{bmatrix} -1/T & 0 & 0 & 1/T \\ 1/J & -D/J & 1/J & 0 \\ 0 & 0 & 0 & 0 \\ 0 & 0 & 0 & 0 \end{bmatrix} \begin{bmatrix} \tau \\ \omega \\ \tau_d \\ \tau_i \end{bmatrix} + \begin{bmatrix} 1/T \\ 0 \\ 0 \\ 0 \end{bmatrix} \tau^* \quad (4)$$

$$\begin{bmatrix} \omega \\ \tau_d \end{bmatrix} = \begin{bmatrix} 0 & 1 & 0 & 0 \\ 0 & 0 & 1 & 0 \end{bmatrix} \begin{bmatrix} \tau \\ \omega \\ \tau_d \\ \tau_i \end{bmatrix}$$

Equation (4) is characterized in that the delay torque (ii) is expressed as a state in addition to the disturbance torque (τd). Further, not only the motor speed (co) but also the disturbance torque (τd) is selected for an output equation. Normally, the disturbance torque (τd) cannot be observed directly in many cases. However, the torque is estimated as the estimated disturbance torque (τdB) by the disturbance estimation block 100 in the first embodiment and the disturbance estimation block 100A in the second embodiment. Therefore, by selecting this torque as an observation amount, an observer in which the disturbance torque (τd) and the delay torque (τi) are separated can be configured. The observer in the third embodiment shown by an equation can be expressed by Equation (5) using an observer gain (L2).

[Math. 5]

$$\frac{d}{dt}\begin{bmatrix} \hat{\tau} \\ \hat{\omega} \\ \hat{\tau}_d \\ \hat{\tau}_i \end{bmatrix} = \begin{bmatrix} -1/T & 0 & 0 & 1/T \\ 1/J & -D/J & 1/J & 0 \\ 0 & 0 & 0 & 0 \\ 0 & 0 & 0 & 0 \end{bmatrix} \begin{bmatrix} \hat{\tau} \\ \hat{\omega} \\ \hat{\tau}_d \\ \hat{\tau}_i \end{bmatrix} + \begin{bmatrix} 1/T \\ 0 \\ 0 \\ 0 \end{bmatrix} \tau^* - L_2 \begin{bmatrix} \omega \\ \tau_d \end{bmatrix} \quad (5)$$

$$\hat{\tau}_i = \begin{bmatrix} 0 & 0 & 0 & 1 \end{bmatrix} \begin{bmatrix} \hat{\tau} \\ \hat{\omega} \\ \hat{\tau}_d \\ \hat{\tau}_i \end{bmatrix}$$

Here, the observer gain (L2) may be set for the purpose of defining the time until the estimation of the estimated delay torque (τiA) converges, stabilizing the delay estimation block, and the like. The observer expressed by (Equation 5) is implemented in the delay estimation block 200 in FIG. 3, and is shown in the block as in FIG. 8.

A delay estimation block 200A in the third embodiment is composed of an input matrix block 206, an observer gain block 207, an observer system matrix block 208, an integral calculation block 209, an output matrix block 210, and a motor simulation model 300. The torque command (τ*A) is input to the input matrix block 206, and the motor speed (ωB) and the estimated disturbance torque (τdB) are input to the observer gain block 207. Further, an estimated state (XB) which is the output of the integral calculation block 209 is input to the observer system matrix block 208. Outputs of the input matrix block 206, the observer gain block 207, and the observer system matrix block 208 are added together, input to the integral calculation block 209, and output as the estimated state (XB). The estimated state (XB), which is the output of the integral calculation block 209, is input to the output matrix block 210 and output as the estimated delay torque (τiA). The estimated delay torque (τiA) is input to the motor simulation model 300 as described in the first embodiment, and is used to calculate the correction amount (ωX) for correcting the motor speed (ωB).

The input matrix block 206, the observer gain block 207, the observer system matrix block 208, and the output matrix block 210 are constant matrices of the state equation represented by Equation (5). In this way, the delay torque (ii) can be obtained (estimated) by inputting the estimated disturbance torque (τdB) to the observer gain block 207 and expressing the delay torque (ii) as a state.

The delay estimation block in the third embodiment has a configuration generally called a same-dimensional observer. However, if necessary, a minimum-dimensional observer, a linear function observer, or the like can be used. Furthermore, it goes without saying that various estimation means such as a stationary Kalman filter which is an optimized version of the same-dimensional observer may also be applied.

Note that the delay estimation block 200A can be used for the purpose of estimating the delay torque (τi) as well as the purpose of estimating other state quantities.

The present embodiment has an advantage of being strong against noise because differentiation as in the delay estimation block 200 described in the first embodiment is not required. Furthermore, since it is not necessary to add a special detection sensor, an increase in product cost can be suppressed.

Fourth Embodiment

Figure 9:
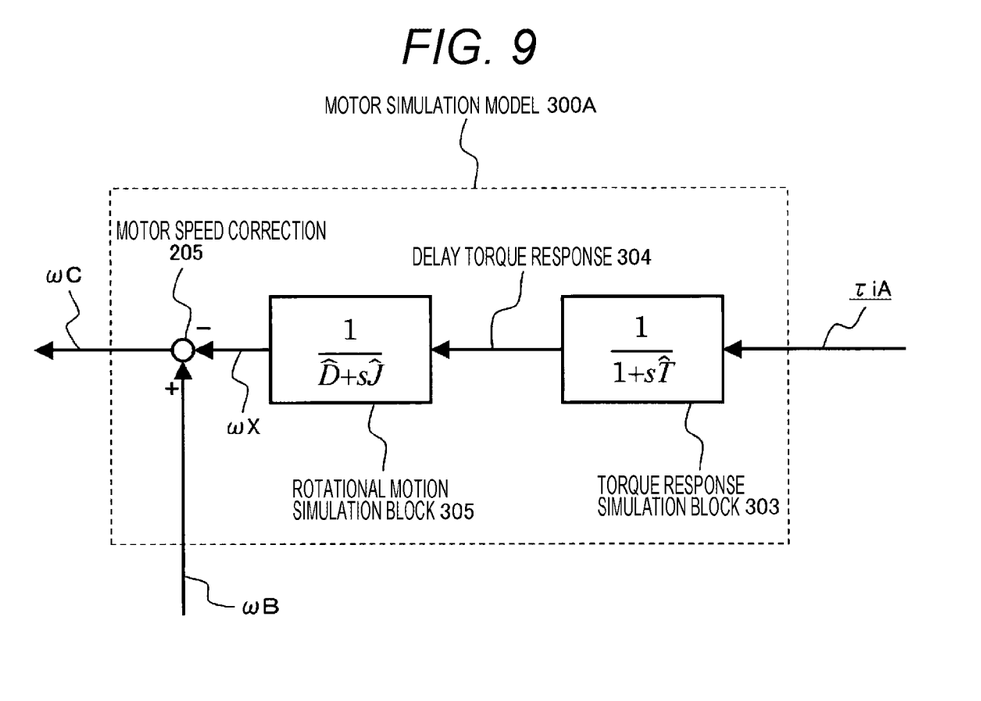
FIG. 9 is a configuration diagram of a motor simulation model according to a fourth embodiment of the present invention.

Next, the motor control device of a fourth embodiment of the present invention will be described with reference to FIG. 9. FIG. 9 is a configuration diagram of a motor simulation model according to the fourth embodiment of the present invention. In the fourth embodiment, the motor simulation model 300 of the delay estimation block 200 used in the first and second embodiments and the delay estimation block 200A used in the third embodiment is set to be faster than the mechanical response of the motor MTR. Specifically, the motor simulation model 300 is set to have a faster response than a mechanical time constant of the motor MTR.

A motor simulation model 300A in the fourth embodiment is composed of a torque response simulation block 303, a rotational motion simulation block 305, and the motor speed correction block 205.

The estimated delay torque (τiA) is input to the torque response simulation block 303 and output as a delay torque response 304. The delay torque response 304 is input to the rotational motion simulation block 305, where a rotational motion by the estimated delay torque (τiA) is obtained (estimated), and output as the correction amount (ωX). The motor speed (ωB) and the correction amount (ωX) are input to the motor speed correction block 205, where a difference between the motor speed (ωB) and the correction amount (ωX) is obtained. The difference between the motor speed (ωB) and the correction amount (ωX) is output as the corrected motor speed (ωC) and sent to the speed control block 20.

The torque response simulation block 303 simulates the torque generation unit 30 in FIG. 1. The torque response simulation block 303 in the fourth embodiment is simulated with a first-order delay of a time constant T as shown in FIG. 8.

The rotational motion simulation block 305 simulates the rotational motion unit 40 of the motor MTR in FIG. 1. In the fourth embodiment, as shown in FIG. 8, a viscous friction coefficient D and the inertia J are used to simulate the first-order delay of a time constant J/D.

In the first to third embodiments, as shown in FIG. 3, the motor simulation model 300 obtains the corrected motor speed (ωC) from a difference between the correction amount (ωX) obtained from the estimated delay torque ($\overline{\tau iA}$) and the motor speed (ωB). The motor simulation model 300A shown in FIG. 9 is basically created based on design values of the motor MTR. However, in many cases, the actual motor MTR seldom have the inertia and the viscous friction coefficient as indicated by the design values, and they fluctuate depending on the fluctuation by the surrounding environment (temperature, and the like). For example, it is generally known that the viscous friction coefficient of the motor MTR increases in a case where the surrounding environmental temperature drops. Even if the inertia is the same before and after a temperature change, the mechanical time constant of the motor MTR decreases as the viscous friction coefficient increases. If the mechanical time constant of the motor MTR fluctuates in this way, a modeling error between the motor simulation model and the motor MTR is generated. Accordingly, even if the estimated delay torque ($\overline{\tau iA}$) estimated by the delay estimation block 200 is estimated accurately, the correction amount (ωX) is sometimes not calculated correctly. In particular, if the response of the motor simulation model 300A is slower than the response of the motor MTR, the correction amount (ωX) becomes insufficient, and there is a problem that the influence of the first delay 10A and the second delay 10B cannot be eliminated.

In the fourth embodiment, the time constant $\overline{T}$ of the torque response simulation block 303 and the time constant $\overline{J/D}$ of the rotational motion simulation block 305, which determine the response of the motor simulation model 300A, are set to be faster than the response of the motor MTR.

If the response of the motor simulation model 300A is made faster than that of the motor MTR, the correction amount (ωX) converges faster. For this reason, the time until the corrected motor speed (ωC) becomes stable is shortened, and there is a characteristic that the motor speed (ωC) can be easily stabilized by the speed control block 20.

The time constant T of the torque response simulation block 303 and the time constant $\overline{J/D}$ of the rotational motion simulation block 305 are preferably set to a response faster than that of the motor MTR with reference to the torque response (T), the inertia (J), and the viscous friction coefficient (D) which are designed in advance as shown by Equation (1). Further, the time constant T of the torque response simulation block 303 and the time constant $\overline{J/D}$ of the rotational motion simulation block 305 do not have to be fixed values, and may be appropriately adjusted with an identification function for identifying parameters of the motor MTR.

According to the fourth embodiment, the response of the motor simulation model 300A is made faster than that of the motor MTR, so that the time for the correction amount (ωX) to converge is shortened, and the corrected motor speed (ωC) is stabilized. In this manner, the motor speed (ωC) can be easily stabilized by the speed control block 20, and the responsiveness of the motor speed (ωC) can be expected to improve.

Fifth Embodiment

Next, a case where the first to fourth embodiments are applied to an electric brake device will be described.

Figure 10:
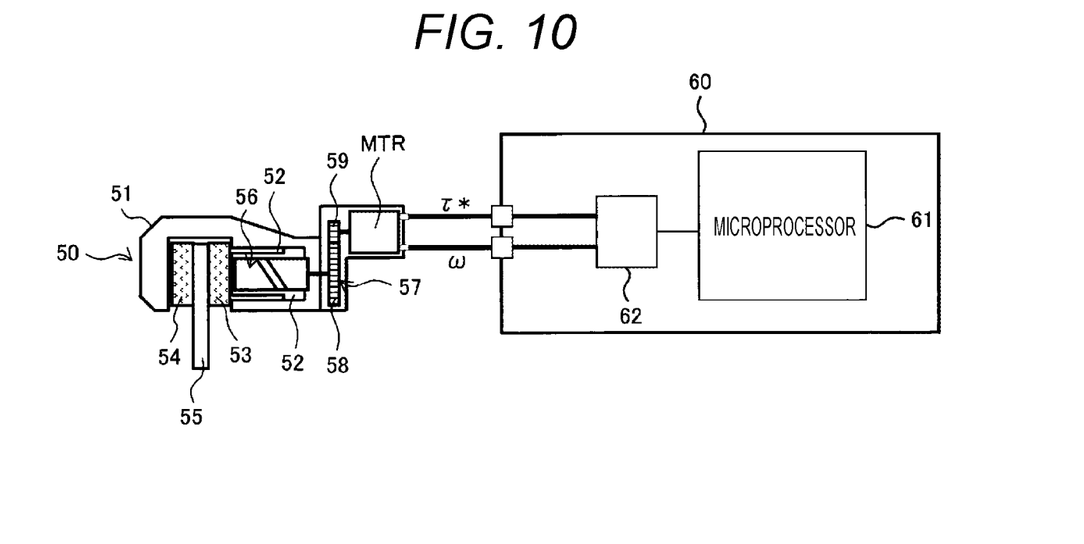
FIG. 10 is a configuration diagram of an electric brake device according to a fifth embodiment of the present invention.

Next, an example in which the motor control device of each of the above-described embodiments is applied to an electric brake device will be briefly described with reference to FIG. 10. FIG. 10 is a configuration diagram of an electric brake device according to a fifth embodiment of the present invention. FIG. 10 shows a configuration of the electric brake device that controls a brake caliper by a rotational force of the motor in place of a hydraulic brake device.

In FIG. 10, the electric brake device includes a brake caliper 50 that provides a braking function, and a piston 52 is disposed inside a caliper main body 51 that constitutes the brake caliper 50. The piston 52 has a function of driving a first brake pad 53. Further, a second brake pad 54 is attached to one end of the caliper main body 51, and a disc rotor 55 fixed to an axle is disposed between the first brake pad 53 and the second brake pad 54. The disc rotor 55 is braked by being sandwiched between the first brake pad 53 and the second brake pad 54.

The piston 52 disposed on the caliper main body 51 is connected to a deceleration mechanism 57 via a rotation/linear motion conversion mechanism 56. The rotation/linear motion conversion mechanism 56 uses a sliding screw, and is composed of a rotary shaft having a spiral screw surface formed on an outer circumference and a linear motion member internally provided with a screw surface screwed with the screw surface of the rotary shaft. The linear motion member is integrally connected to the piston 52, and the linear motion member can move the piston 52 in the axial direction of the rotary shaft by the rotation of the rotary shaft.

Further, in the fifth embodiment, the rotation/linear motion conversion mechanism 56 is provided with a self-locking function unit. If the rotary shaft is rotated, the linear motion member moves linearly. If the rotation of the rotary shaft is stopped, the linear motion member maintains its position even if a force acts on the linear motion member in the linear motion direction. That is, the rotary shaft and the linear motion member have a spiral screw surface having a lead angle smaller than a friction angle, by which the self-locking function is obtained. The rotation/linear motion conversion mechanism 56 using this type of screw surface is well known.

As shown in FIG. 10, the rotary shaft is fixed to a large-diameter gear 58 of the deceleration mechanism 57, and the large-diameter gear 58 meshes with a small-diameter gear 59. The small-diameter gear 59 is rotated by the motor MTR, and the rotation of the motor MTR is transmitted to the small-diameter gear 59 and the large-diameter gear 58 and the speed is reduced. When the large-diameter gear 58 is rotated, the rotational torque of the motor MTR is amplified and transmitted to the rotation/linear motion conversion mechanism 56 fixed to the rotary shaft.

The supply of electric power (torque command) to the motor MTR is controlled by an electronic control means 60 including a motor control function unit shown in FIGS. 1 to 5 and 6 to 9 described above, and the motor control function unit is composed of a well-known microprocessor 61, an input/output circuit 62, and the like. In the fifth embodiment, the electronic control means 60 corresponds to the upper control device (ECU 1), and the motor MTR includes the lower control device (ECU 1). Then, in a case braking operation is performed, a predetermined electric power is supplied from the electronic control means 60 to the motor MTR to rotate the motor MTR, and this rotation rotates the rotary shaft via the gears 58 and 59 of the deceleration mechanism 57. When the rotary shaft rotates, the linear motion member and the piston 52 move to the left side in FIG. 10 and press the first brake pad 53 against a disc rotor 55 with a predetermined thrust (pressing force) to apply braking.

Then, in this type of electric brake device, a phenomenon that the braking force cannot be quickly transmitted to the disc rotor unless the control response is high when a brake pedal is depressed, and a phenomenon that, when an overshoot occurs, the braking force is applied to the disc rotor too much occur.

Further, in such an electric brake device, since the motor MTR is installed near the disc rotor 55, the motor MTR is easily affected by the frictional heat generated by the disc rotor 55. Furthermore, in a case where the motor MTR is kept at a fixed position in order to maintain the braking force, it is necessary to continue supplying electric power (torque command) to the motor MTR, which leads to an increase in the temperature of the motor MTR. As described above, in the electric brake device, the motor MTR is placed under an environment where the temperature tends to rise.

Then, in a case where the temperature of the motor MTR rises excessively, for example, the temperature rise can be prevented by a measure such as temporarily limiting the supply amount of electric power (torque command) by the electronic control means 60. However, in this case, the control command of the motor MTR and the control amount cannot be matched with each other, and a steady state deviation occurs. In addition, steady state deviation occurs due to the clogging on the mechanism side and the increase in frictional force due to aging.

In a state where such a steady state deviation occurs, for example, in a case where the control command is suddenly changed (what is called step change) by sudden operation of the brake pedal, if the electronic control means 60 is provided with an integral control function, an overshoot may be caused as described above and a phenomenon, such as that a too much braking force is applied to the disc rotor 55 or that the motor MTR rotates in the reverse direction too far and the mechanism is damaged, may be generated.

In contrast, the electric brake device of the fifth embodiment includes the motor control function unit shown in FIGS. 1 to 5 and 6 to 9 described above. The electronic control means 60 includes a disturbance estimation unit and a delay estimation unit.

The disturbance estimation unit estimates the disturbance by using the torque command input to the motor and the feedback value of the motor. The delay estimation unit estimates the delay using the torque command, the feedback value of the motor, and the disturbance torque estimated by the disturbance estimation unit.

Further, the disturbance estimation unit includes the back-calculated torque calculation unit that obtains the back-calculated torque by back-calculating the feedback value of the motor and the estimated disturbance torque calculation unit that estimates the disturbance as the disturbance torque from a difference between the back-calculated torque calculated by the back-calculated torque calculation unit and the torque command, and sends the disturbance torque to the delay estimation unit.

Further, the delay estimation unit includes the delay torque calculation unit that calculates the delay torque based on the feedback value of the motor, the disturbance torque, and the torque command.

Furthermore, the delay estimation unit includes the motor simulation model that simulates the motor, and inputs the delay torque to the motor simulation model to correct the feedback value of the motor recognized by the electronic control means 60.

With the above configuration, according to the fifth embodiment, it is possible to quickly set the braking force corresponding to the depression amount of the brake pedal and obtain predetermined braking operation. For this reason, a phenomenon that the braking force cannot be quickly transmitted to the disc rotor when the brake pedal is depressed, and a phenomenon that, when an overshoot occurs, the braking force is applied to the disc rotor too much can be reduced.

Further, according to the fifth embodiment, even in a case where a steady state deviation occurs due to a temperature increase of the motor MTR, clogging on the mechanism side, an increase in frictional force due to aging, and the like, and a rapid change in the control command occurs due to sudden operation of the brake pedal, an advantage of suppressing an excessive braking force acting on the disc rotor 55 or excessive reverse rotation of the motor MTR can be achieved by inclusion of the motor control function unit shown in any of FIGS. 1 to 5 and 6 to 9.

Note that the present invention is not limited to the above embodiments and includes a variety of variations. For example, the above embodiments are described in detail for easier understanding of the present invention, and the present invention is not necessarily limited to the embodiments that include the entirety of the described configurations. Further, part of a configuration of a certain embodiment can be replaced with a configuration of another embodiment, and a configuration of a certain embodiment can also be added to a configuration of another embodiment. For part of a configuration of each embodiment, other configurations may be added, removed, or replaced.

REFERENCE SIGNS LIST 10A first delay
10b second delay
20 speed control block
30 torque generation unit
40 rotational motion unit
50 brake caliper
51 caliper main body
52 piston
53 first brake pad
54 second brake pad
55 disc rotor
56 rotation/linear motion conversion mechanism
57 deceleration mechanism
58 large-diameter gear
59 small-diameter gear
60 electronic control means
61 microprocessor
62 input/output circuit
100 disturbance estimation block
100a disturbance estimation block
101 back-calculated torque calculation block
102 estimated disturbance torque calculation block
103 low-pass filter
104 input matrix block
105 observer gain block
106 observer system matrix block
107 integral calculation block
108 output matrix block
200 delay estimation block
200A delay estimation block
201 back-calculated torque calculation block
202 disturbance torque removal block
203 low-pass filter
204 delay torque calculation block
205 motor speed correction block
206 input matrix block
207 observer gain block
208 observer system matrix block
209 integral calculation block 210 output matrix block
300 motor simulation model
300a motor simulation model
301 filter
302 correction amount calculation block
303 torque response simulation block
304 delay torque response
305 rotational motion simulation block

The invention claimed is:

1. A motor control device comprising:
a motor;
a first electronic control unit (ECU); and
a second ECU;
wherein the first ECU sends a torque command to the second ECU based on a command value,
wherein
the first ECU is configured to estimate disturbance by using a torque command input to the second ECU and a feedback value of the motor, and
estimate a delay by using a torque command output from the first ECU, the feedback value of the motor, and disturbance torque; and
the second ECU is configured to control rotation of the motor based at least in part on the torque command output.

2. The motor control device according to claim 1, wherein the first ECU is configured to obtain back-calculated torque by back-calculating the feedback value of the motor, and estimate the disturbance as the disturbance torque, from a difference between the back-calculated torque and the torque command.

3. The motor control device according to claim 1, wherein the first ECU is configured to calculate delay torque based on the feedback value of the motor, the disturbance torque, and the torque command.

4. The motor control device according to claim 3, wherein the first ECU includes a motor simulation model that simulates the motor, and inputs the delay torque to the motor simulation model to correct the feedback value of the motor.

5. The motor control device according to claim 4, wherein a response time of the motor simulation model is smaller than a mechanical response time of the motor.

6. The motor control device according to claim 1, wherein the first ECU includes:
a mathematical model for estimating an internal state of the motor, and
an observer or a Kalman filter, the observer estimating the disturbance torque from the torque command and the feedback value of the motor.

7. The motor control device according to claim 1, wherein the first ECU includes:
a mathematical model for estimating an internal state of the motor, and
an observer or a Kalman filter, the observer estimating the delay torque from the torque command, the feedback value of the motor, and the disturbance torque.

8. A motor control device comprising:
a motor; and
an electronic control unit (ECU) that generates a torque command to be input to the motor;
wherein the motor is configured to receive voltage based on the torque command, and
the ECU is configured to:
estimate disturbance of the motor from a feedback value that is a control amount of the motor and voltage applied to the motor, and
estimate a delay from the torque command, the feedback value, and the disturbance,
stop estimating the disturbance of the motor while the motor is performing unloaded operation,
estimate a delay from the torque command and the feedback value while the motor is performing unloaded operation, and
control rotation of the motor based at least in part on the torque command,
wherein the delay is set to the voltage.

9. An electric brake device comprising:
a motor;
a piston that presses a brake pad against a disc rotor;
a rotation/linear motion conversion mechanism that converts a rotational motion output of the motor into a linear motion to propel the piston; and
an electronic control unit (ECU) configured to:
estimate disturbance by using a torque command input to the motor and a feedback value of the motor,
estimate delay estimation unit estimate a delay by using the torque command, the feedback value of the motor, and disturbance torque, and
control rotation of the motor based at least in part on the torque command.

10. The electric brake device according to claim 9, wherein the ECU is configured to obtain back-calculated torque by back-calculating the feedback value of the motor, and estimate the disturbance as the disturbance torque, from a difference between the back-calculated torque and the torque command.

11. The electric brake device according to claim 9, wherein the ECU is configured to calculate delay torque based on the feedback value of the motor, the disturbance torque, and the torque command.

12. The electric brake device according to claim 11, wherein the ECU includes a motor simulation model that simulates the motor, and inputs the delay torque to the motor simulation model to correct the feedback value of the motor.

* * * * *